(12) United States Patent
Terada et al.

(10) Patent No.: US 9,558,910 B2
(45) Date of Patent: Jan. 31, 2017

(54) SAMPLE HOLDER FOR ELECTRON MICROSCOPE

(71) Applicant: HITACHI HIGH-TECHNOLOGIES CORPORATION, Tokyo (JP)

(72) Inventors: Shohei Terada, Tokyo (JP); Yoshifumi Taniguchi, Tokyo (JP); Yasuhira Nagakubo, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/371,032

(22) PCT Filed: Dec. 3, 2012

(86) PCT No.: PCT/JP2012/081231
§ 371 (c)(1),
(2) Date: Jul. 8, 2014

(87) PCT Pub. No.: WO2013/111453
PCT Pub. Date: Aug. 1, 2013

(65) Prior Publication Data
US 2014/0353499 A1  Dec. 4, 2014

(30) Foreign Application Priority Data
Jan. 25, 2012 (JP) ................. 2012-012610

(51) Int. Cl.
*H01J 37/00* (2006.01)
*H01J 37/20* (2006.01)
(Continued)

(52) U.S. Cl.
CPC ............... *H01J 37/20* (2013.01); *H01J 37/26* (2013.01); *H01J 37/28* (2013.01);
(Continued)

(58) Field of Classification Search
CPC ............ H01J 37/20; H01J 37/28; H01J 37/26; H01J 2237/20214; H01J 2237/2802; H01J 2237/2007; H01J 2237/201; H01J 2237/20; H01J 2237/20207; H01J 2237/20221
(Continued)

(56) References Cited

U.S. PATENT DOCUMENTS

| 4,950,909 | A | * | 8/1990 | Yokoto | ................... | H01J 37/20 |
| | | | | | | 250/442.11 |
| 5,225,683 | A | * | 7/1993 | Suzuki | ................... | H01J 37/20 |
| | | | | | | 250/442.11 |

(Continued)

FOREIGN PATENT DOCUMENTS

| JP | 06-103947 A | 4/1994 |
| JP | 08-087972 A | 4/1996 |

(Continued)

OTHER PUBLICATIONS

Translation of the Japanese Office Action received in corresponding Japanese Application No. 2012-012610 dated May 26, 2015.

*Primary Examiner* — Michael Maskell
(74) *Attorney, Agent, or Firm* — Mattingly & Malur, PC

(57) ABSTRACT

A sample holder for an electron microscope has multiple sample stands, can allow at least one sample stand to move, and enables multiple samples for a transmission electron microscope to be prepared by a focused ion beam apparatus. A holder tip opening is provided in a tip of the sample holder. A back end of the sample holder has a knob, a rolling mechanism, a coarse adjustment mechanism, and a connector. By pressing the knob, fixation of the rolling mechanism is canceled, and the back end from the rolling mechanism and the tip of the sample holder will rotate. This rolling mechanism enables arrangement of the samples to be rotated in both the observing of a sample and the preparing of a (Continued)

sample for a transmission electron microscope with the focused ion beam apparatus. Moreover, the sample stand is movable by the coarse adjustment mechanism and the fine adjustment mechanism.

9 Claims, 15 Drawing Sheets

(51) Int. Cl.
 *H01J 37/26* (2006.01)
 *H01J 37/28* (2006.01)
(52) U.S. Cl.
 CPC . *H01J 2237/201* (2013.01); *H01J 2237/2007* (2013.01); *H01J 2237/20214* (2013.01); *H01J 2237/2802* (2013.01)
(58) Field of Classification Search
 USPC ....... 250/306, 307, 310, 311, 440.11, 442.11
 See application file for complete search history.

(56) References Cited

U.S. PATENT DOCUMENTS

| | | | | |
|---|---|---|---|---|
| 6,388,262 | B1 * | 5/2002 | Alani | H01J 37/20 250/442.11 |
| 6,576,910 | B2 * | 6/2003 | Hashikawa | H01J 37/20 250/442.11 |
| 7,800,077 | B2 * | 9/2010 | Moriya | H01J 37/20 250/440.11 |
| 8,581,207 | B2 * | 11/2013 | Kim | H01J 37/20 250/442.11 |
| 2002/0005492 | A1 * | 1/2002 | Hashikawa | H01J 37/20 250/442.11 |
| 2002/0050565 | A1 * | 5/2002 | Tokuda | G01N 23/225 250/310 |
| 2011/0155906 | A1 * | 6/2011 | Terada | H01J 37/20 250/307 |
| 2011/0180724 | A1 * | 7/2011 | Terada | H01J 37/185 250/442.11 |
| 2011/0253905 | A1 * | 10/2011 | Moebus | G21K 7/00 250/441.11 |
| 2012/0212583 | A1 * | 8/2012 | Yaguchi | G01N 23/2204 348/46 |

FOREIGN PATENT DOCUMENTS

| | | | | |
|---|---|---|---|---|
| JP | 10-302700 | A | | 11/1998 |
| JP | 2000-214056 | A | | 8/2000 |
| JP | 2004241255 | A | * | 8/2004 |
| JP | 2004-301851 | A | | 10/2004 |
| JP | 2007-033186 | A | | 2/2007 |
| JP | 2010-009943 | A | | 1/2010 |
| JP | 2012-049008 | A | | 3/2012 |
| JP | 2012-104502 | A | | 5/2012 |
| WO | WO 2011052489 | A1 | * | 5/2011 ......... G01N 23/2204 |

* cited by examiner (a) TRANSMISSION ELECTRON MICROSCOPE IMAGE (b) SPECTRUM IMAGE (c) ELECTRON ENERGY LOSS SPECTRUM OBTAINED AT EACH PLACE

ELECTRON RAY
INCIDENT DIRECTION ⊗ → ENERGY DISPERSIVE AXIS

ELECTRON RAY INCIDENT DIRECTION ⊗ → ENERGY DISPERSIVE AXIS

ENERGY DISPERSIVE AXIS
↑
ELECTRON RAY
INCIDENT DIRECTION ⊗

ELECTRON RAY
INCIDENT DIRECTION  ⊗ → ENERGY DISPERSIVE AXIS

ENERGY DISPERSIVE AXIS

⊗ y-AXIS

ELECTRON RAY
INCIDENT DIRECTION ⊗ → ENERGY DISPERSIVE AXIS

SAMPLE HOLDER FOR ELECTRON MICROSCOPE

TECHNICAL FIELD

The present invention enables processing of multiple TEM samples in a focused ion beam in a sample holder for a transmission electron microscope that can arrange multiple sample stands on each of which a sample is mounted and can move in three axis directions.

BACKGROUND ART

Processing sizes such as of a semiconductor device, a magnetic device, etc. have become minute and they are highly integrated, and deterioration of device characteristics and degradation of reliability have become important problems more than before. In recent years, in order to analyze failures of semiconductor devices in nanometer regions and ascertain causes of the failures fundamentally to solve them in processes of a development of a new process and mass production, there have become indispensable analysis means not only image observation by (scanning) transmission electron microscopy ((S)TEM) but also crystallography by electron diffraction, spectrum analysis and two-dimensional element distribution analysis both of which use electron energy loss spectroscopy (EELS), energy dispersive X-ray spectroscopy (EDX), etc.

Moreover, in materials for energy conversion and environmental protection such as a positive electrode material of the lithium ion battery, rapid improvement in material characteristics more than before is desired. In order to improve the material characteristics, control of a structure in a nanometer level and a chemical bonding state hold important keys. Therefore, needs of the above-mentioned analysis technology are increasing.

Here, a measuring method for measuring an electron energy loss spectrum will be explained in detail out of the above-mentioned analysis means.

The electron energy loss spectra can be divided roughly into a zero loss spectrum that no energy is lost when passing through a sample, a plasmon loss spectrum obtained by exciting electrons in a valence band to lose energy, and an inner shell electron excitation loss spectrum obtained by exciting inner shell electrons to lose energy. In the inner shell electron excitation loss (core loss) spectrum, a fine structure is observed near an absorption edge.

This structure is called an absorption edge fine structure (Energy Loss Near-Edge Structure: ELNES), and has information reflecting an electronic state and a chemical bonding state of the sample. Moreover, since the energy loss value (an absorption edge position) is inherent to an element, qualitative analysis is possible. Moreover, since information relevant to coordination surrounding an attention element can also be acquired from a shift of the absorption edge position called a chemical shift, simple state analysis is also possible.

Conventionally, in the case of acquiring the electron energy loss spectra in different places on the sample, by combining a scanning transmission electron microscope that is made to scan a narrowly focused electron ray on the sample by a scanning coil and an electron spectrometer capable of conducting spectroscopy depending on an energy quantity that the electron ray has, electrons having penetrated the sample were subjected to spectroscopy and the electron energy loss spectrum was continuously acquired.

However, in the case of this technique, since aberration and an origin point of the electron energy loss spectrum vary by a drift of an acceleration voltage of the electron ray and variations of a magnetic field and an electric field that accompany a disturbance variation in a circumference of the apparatus, it is difficult to compare shapes of the absorption edge fine structures of the electron energy loss spectra and slight chemical shifts at measuring positions.

Then, for example, Patent Literature 1 describes that while a normal transmission electron microscope obtains a transmission electron microscope image such that focal positions of both the x-axis and the y-axis are set on the same plane, the above-mentioned transmission electron microscope includes an electron spectrometer and, by differentiating the focal positions of the x-axis and the y-axis, acquires a two-dimensional image such that the focal position of the x-axis is set on the spectrum plane and, on the other hand, the focal position of the y-axis is set on an image plane with the image detector.

As a result, the electron energy loss spectrum in a y-axis direction of the sample can be separated and observed. That is, an image obtained by an image detector can be observed as a spectral image whose x-axis represents an energy loss amount, i.e., is an energy dispersion axis, and whose y-axis has position information of the sample as shown in FIG. 2(b). The spectral image is observed in a belt-like shape corresponding to each layered film of the transmission electron microscope image shown in FIG. 2(a). Moreover, if the intensity profile of the spectral image is extracted in each place corresponding to each layered film from FIG. 2(a), it will be possible to simultaneously observe the electron energy loss spectra at different positions of the sample as show in FIG. 2A, which will make it possible to compare in detail the absorption edge fine structures of the electron energy loss spectra at different positions and slight chemical shifts.

A spectral image whose x axis has an energy loss amount and whose y-axis has position information of the sample that is described in the patent Literature 1 is a two-dimensional image obtained with an image detector by altering a lens action of the electron spectrometer, etc. and differentiating focal positions on the x-axis and the y-axis, that is, it is possible to simultaneously observe the electron energy loss spectra of multiple points at different positions of the sample. This technology discloses a technology by which the spectral images, i.e., the electron energy loss spectra are acquired from multiple different points in one sample, and the chemical shifts caused by differences in chemical bonding states are discussed.

Moreover, Patent Literature 2 discloses a sample holder for a transmission electron microscope by which spectral images can be acquired simultaneously from multiple samples, and electron energy loss spectra and chemical shifts can be measured.

The sample holder for a transmission electron microscope disclosed in Patent Literature 2 has a sample stage on which multiple sample stands can be arranged. Moreover, at least one sample stage can be moved by a moving mechanism, and multiple sample stands can be brought closer together.

The sample holder for a transmission electron microscope disclosed in the abovementioned Patent Literature 2 enables the Spectral images to be acquired from multiple samples simultaneously, which makes it possible to measure electron energy loss spectra and chemical shifts.

With the above-mentioned technology, it is possible to acquire the spectral images from the multiple samples simultaneously. However, in a holder of the above-mentioned technology, although an opening through which an electron ray passes is provided in a sample tip, an opening by which an ion beam is irradiated on the sample is not provided in a focused ion beam (FIB) apparatus used of preparation of a TEM sample, etc.; therefore, a thin sample for TEM cannot be prepared in the FIB using the holder of the above-mentioned technology. Therefore, after preparing a TEM sample by the FIB using another sample holder, it is necessary to reinstall it in the above-mentioned sample holder.

Patent Literature 3 discloses TEM sample preparation by the FIB and a sample holder that enables TEM observation.

With the above-mentioned disclosed technology, although sample preparation and TEM observation by the FIB is possible using the same sample holder, only one sample stand can be installed. Moreover, since the sample stand is unmovable, it is difficult to acquire EELS's simultaneously from the samples mounted on multiple sample stands.

CITATION LIST

Patent Literature

Patent Literature 1: Japanese Unexamined Patent Application Publication No. Hei10 (1998)-302700
Patent Literature 2: Japanese Unexamined Patent Application Publication No. 2010-009943
Patent Literature 3: Japanese Unexamined Patent Application Publication No. Hei6 (1994)-103947

SUMMARY OF INVENTION

Technical Problem

An object of the present invention is to provide a sample holder for an electron microscope that can arrange therein multiple sample stands, can allow at least one sample stand to move, enables multiple TEM samples to be processed in a focused ion beam apparatus, and makes it possible to acquire a transmission electron microscope image, an electron diffraction image, a spectral image, a scanning transmission electron microscope image, etc. from all the samples arranged in the sample holder at high spatial resolution, and the sample stand.

Solution to Problem

That is, the sample holder for an electron microscope according to one mode of the present invention can arrange multiple sample stands thereon, and includes a sample driving part for moving the sample stand, a rolling mechanism part for rotating the sample stand, and an opening in a sample holder tip.

Advantageous Effects of Invention

According to the present invention, there can be realized a sample holder that can arrange therein multiple sample stands, can allow at least one sample stand to move, enables multiple samples for a transmission electron microscope to be processed in the focused ion beam apparatus, and makes it possible to acquire the transmission electron microscope image, the electron diffraction image, the spectral image, the scanning transmission electron microscope image, etc. from all the samples arranged in the sample holder, and a sample stand.

Moreover, since the sample holder is one that can be used in common in both the transmission electron microscope and the focused ion beam apparatus, a rough sample position can be set at the time of mounting the sample, the coarse adjustment mechanism that moves in the three axis directions in the conventional technology needs to move only in one-axis direction, and therefore weight reduction of a back end of the sample holder can be attained and the sample drift can also be reduced.

BRIEF DESCRIPTION OF DRAWINGS

FIG. 1 is a sample holder that is an embodiment of the present invention, in which FIG. 1(a) and FIG. 1(b) are an outline top view and a side view, respectively, when a sample is observed with transmission electron microscope.

FIG. 3 is a sample holder that is an embodiment of the present invention, in which FIG. 3(a) and FIG. 3(b) are an outline top view and a side view, respectively, when the sample is processed by a focused ion beam apparatus.

DESCRIPTION OF EMBODIMENT

Hereinafter, embodiments of the present invention will be described in detail based on drawings. Incidentally, in all diagrams for explaining the embodiments, the same reference sign is given to the same component as a principle, and its repeated explanation is omitted.

Figure 15:
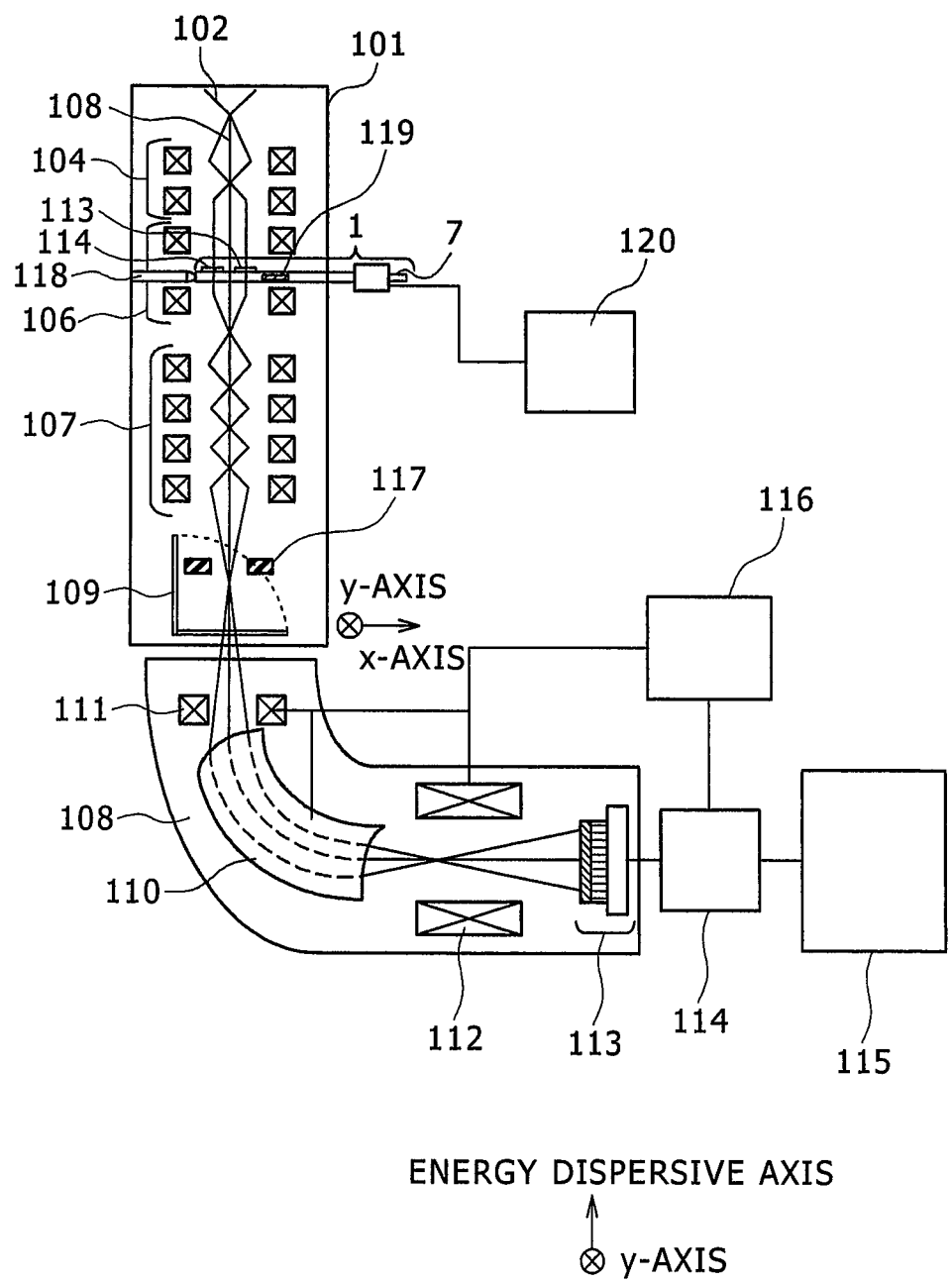
FIG. 15 is an outline configuration diagram of the transmission electron microscope to which one embodiment of the present invention is applied.

FIG. 15 is an outline configuration diagram schematically showing a configuration of a transmission electron microscope apparatus that is one embodiment according to the present invention. Incidentally, a transmission electron microscope apparatus 101 has an electron spectrometer 108.

The transmission electron microscope apparatus 101 of this embodiment includes
an electron source 102 for emitting an electron ray 103, a convergent lens 104, an objective lens 106, an imaging lens system 107 (an imaging lens), a fluorescent screen 109, the electron spectrometer 108, an image display 114, a data storage device 115, and a central controller 116. Between the convergent lens 104 and the objective lens 106, a sample holder for a transmission electron microscope having multiple sample stands 13, 14 (hereinafter designated as a sample holder) 1 is arranged. The sample is being fixed to the sample stands 13, 14.

The electron spectrometer 108 includes a magnetic sector 110, multipole lenses 111, 112, and an image detector 113.

Incidentally, a configuration of the transmission electron microscope apparatus 101 and a configuration of the electron spectrometer 108 are not limited to this. Moreover, a position at which the electron spectrometer 108 is arranged is also not limited in particular. In this embodiment, although the electron spectrometer 108 is arranged between the fluorescent screen 109 and the image display 114, the electron spectrometer 108 may be arranged in the midst of the imaging lens system 107.

In this transmission electron microscope apparatus 101, the electron ray 103 emitted from the electron source 102 passes through the convergent lens 104, and is irradiated on the samples fixed to the sample stands 13, 14. The electron ray 103 having penetrated the sample passes though the objective lens 106 and the imaging lens system 107 comprised of multiple lenses. When the fluorescent screen 109 is opened, the electron ray 103 enters into the electron spectrometer 108 as it is.

The electron ray 103 that entered into the electron spectrometer 108 passes through multipole lenses 111, 112 used for aberration reduction of an electron energy loss spectrum, etc. and the magnetic sector 110 that can perform spectroscopy depending on an energy quantity that the electron ray 103 has in the electron spectrometer 108, subsequently is photographed by the image detector 113 as a transmission electron microscope image, a two-dimensional element distribution image, a spectral image, etc., after this, is displayed on the image display 114 and is stored in the data storage device 115. Moreover, the magnetic sector 110 and the multipole lenses 111, 112 are controlled in the central controller 116. Moreover, the central controller 116 can control switching of acquisition modes of the transmission electron microscope image, the two-dimensional element distribution image, and the spectral image.

The image detector 113 can also be arranged directly under the fluorescent screen 109, and can acquire the transmission electron microscope image and an electron diffraction image before the electron ray enters into the electron spectrometer 108. In the case where the electron ray 103 is intended to pass through the electron spectrometer 108, it is also possible to remove the image detector 113 from a path of the electron ray 103.

When acquiring the spectral image, in order to restrict a location at which the spectrum is intended to be acquired, a field-of-view restriction slit 117 that is short in a x-axis direction, i.e., the same direction as an energy dispersion axis and is long in a y-axis direction, i.e., a direction of sample measuring position may be inserted.

The whole of the sample holder 1 can be moved inside a transmission electron microscope 101 by a sample holder moving device 118. Moreover, the sample holder 1 has a coarse adjustment mechanism 7 capable of moving the sample in a wide range and a fine adjustment mechanism 119 for performing potion adjustment in order to certainly bring the sample stand closer to a desired position, and the fine adjustment mechanism 119 can move the sample stand with a sample moving device 120.

In FIG. 15, although the coarse adjustment mechanism 7 of the sample holder 1 is described supposing that the sample stage for driving is moved manually, it can also be moved by the sample moving device 120 Similarly with the fine adjustment mechanism 119.

At least one of the sample stands 13, 14 is movable in a major axis direction of the sample holder 1 by the coarse adjustment mechanism 7 and the fine adjustment mechanism 119, and is moved at any time so that the electron energy loss spectra of the samples fixed to the sample stands 13, 14 can be acquired simultaneously. An arrangement of the samples fixed to the sample stands 13, 14 can be carried out, checking it with the fluorescent screen 9, the image display 14, etc.

Figure 1:
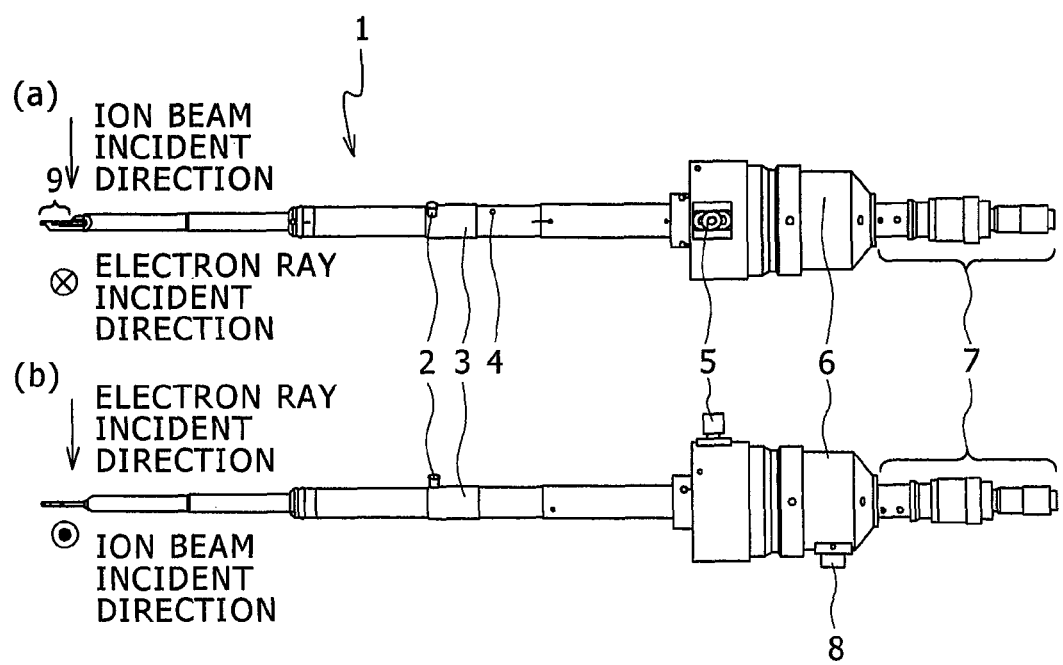
Figure 2:
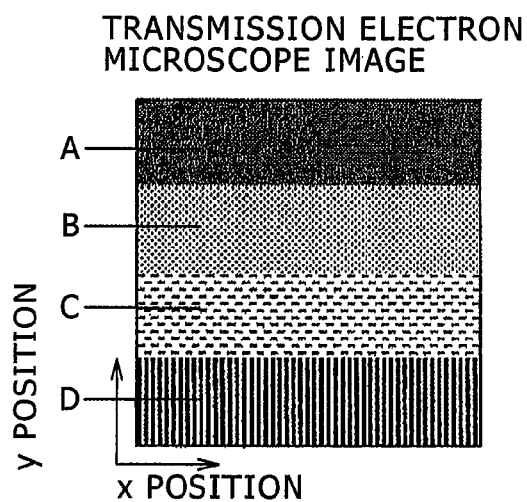
FIG. 2 is an explanatory diagram of a transmission electron microscope image, a spectral image, and an electron energy loss spectrum obtained by the transmission electron microscope.
Figure 2:
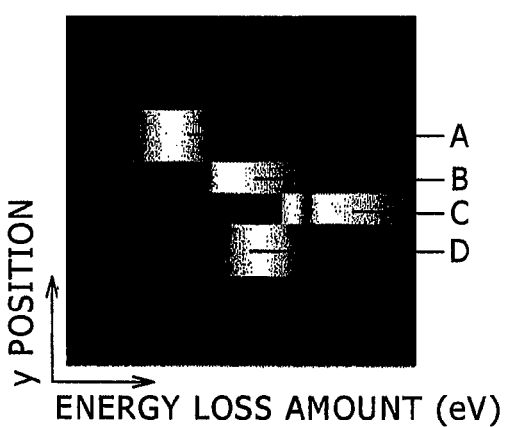
Figure 2:
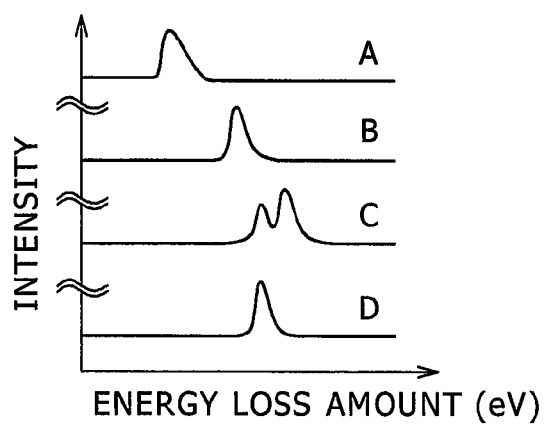

FIG. 1 shows the sample holder 1 shown in FIG. 15, in which FIG. 1(a) is an outline top view and FIG. 1(b) is a side view when observing the sample with the transmission electron microscope.

A holder tip opening 9 is provided in a tip of the sample holder 1. Moreover, a guide pin 2, a guide cover 3, and a guide pin hole 4 are provided in the center of the sample holder 1. The guide pin 2 can be valuable in size depending on the size of a case of the transmission electron microscope 101. For example, modifications can be performed: in the case of an acceleration voltage being 200 kV, the guide pin hole 4 corresponds to a position of the guide pin in the current state; and in the case of an acceleration voltage being 300 kV, the guide pin hole 4 can be changed to correspond to the guide pin 2. Moreover, when changing a position of the guide pin 2, the guide cover 3 is also made to slide simultaneously to strengthen fixation of the guide pin 2.

The sample holder 1 has a knob 5, a rolling mechanism 6, the coarse adjustment mechanism 7, and a connector 8 at its back end. By pressing the knob 5, fixation of the rolling mechanism 6 is canceled, and the back end from the rolling mechanism 6 and the tip of the sample holder will rotate. The sample holder 1 has a two-layer structure: the coarse adjustment mechanism 7 and the tip of the sample holder are linked together, and the coarse adjustment mechanism 7 and the tip of the sample holder linked with the coarse adjustment mechanism 7 rotate with rotation of the rolling mechanism 6. This rolling mechanism enables the arrangement of the samples to be rotated in both the case of observing the sample with the transmission electron microscope and the case of preparing a sample for a transmission electron microscope with the focused ion beam apparatus.

The coarse adjustment mechanism 7 is arranged in an end part of the sample holder 1, and is movable in the major axis direction of, the sample holder 1. Although a micrometer head was used in the present invention, a method for moving the sample stage With the coarse adjustment mechanism 7 is not limited to this.

The fine adjustment mechanism 119 is arranged inside the sample holder 1, and the connector 8 is used in order to couple an electric cable for making the fine adjustment mechanism 119 operate and the sample fine adjustment controller 120. In the present invention, although a cable type coupling method was selected in an operation of the fine adjustment mechanism 119, it is also possible to operate the fine adjustment mechanism 119 by a wireless type. Moreover, it is desirable for the connector 8 to be arranged on a lower part side to an incident direction of the electron ray 103. Moreover, with rotation of the rolling mechanism 6, the fine adjustment mechanism 119 arranged between the coarse adjustment mechanism 7 and the tip of the sample holder also rotates.

Figure 3:
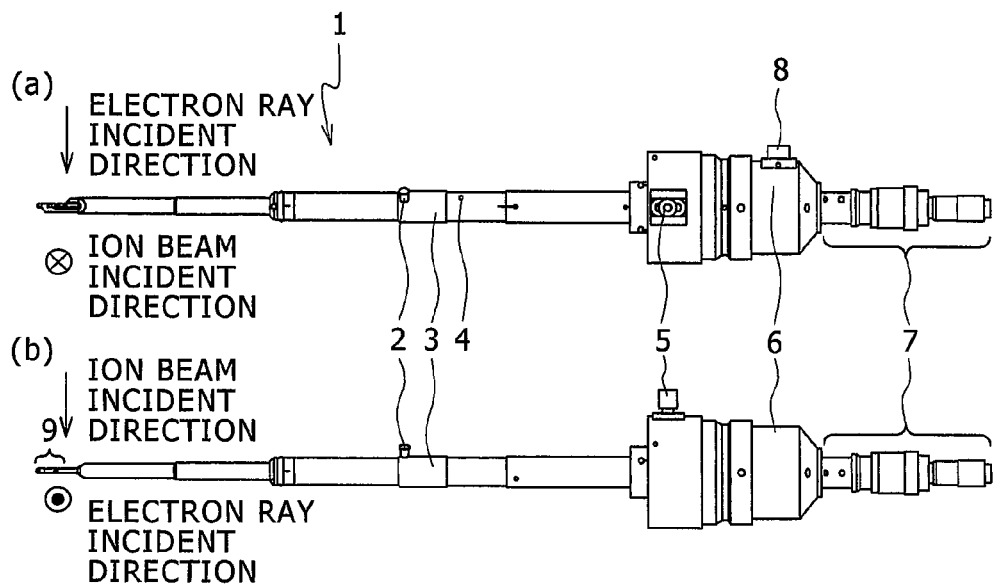

FIG. 3 is the sample holder 1 shown in FIG. 15, and is an outline top view 3(a) and a side view 3(b) when processing the sample for a transmission electron microscope with the focused ion beam apparatus.

In FIG. 3, when processing the sample for a transmission electron microscope with the focused ion beam apparatus, the sample is arranged at a position at which the holder tip opening 9 intersects perpendicularly with it as compared with the tip in the case of observing the tip with the transmission electron microscope 101 of FIG. 1. Although in this invention, the case where the incident direction of the electron ray and an incident direction of the ion beam intersect perpendicularly is assumed, rotation of the tip of the sample holder 1 is not limited to this.

Figure 4:
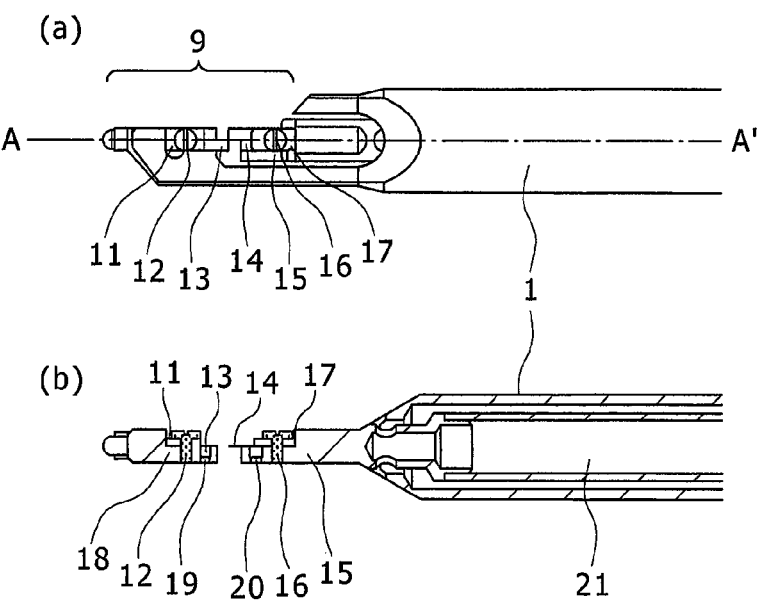
FIG. 4 (a) is an outline sectional view in which a tip of the sample holder that is the embodiment of the present invention is enlarged, and FIG. 4 (b) is an outline sectional view taken along a line A-A' shown in FIG. 4(a).

FIG. 4 is an outline top view 4(a) of enlarging the tip of the sample holder that is the embodiment of the present invention and an outline sectional view 4(b) taken along a line A-A' shown in 4(a).

In FIG. 4, the holder tip opening 9 is provided in the tip of the sample holder 1 as described above. Moreover, a sample stage 18 is a stage for installing a sample stand 13, and is arranged in the sample holder 1. The sample stand 13 is fixed to the sample stage 18 by a holding screw 12 through a sample stand presser plate 11.

On the other hand, a sample stand 14 is fixed to a sample stage 15 for driving. A fixation method being described above, the sample stand 14 is fixed to the sample stage 15 for driving by a holding screw 16 through a sample stand presser plate 17. Incidentally, the fixation method for fixing each sample stand to the sample stage is not limited to this, and there are also considered, for example, fixation with a pushing spring and fixation with an adhesive tape.

Moreover, since the sample stage 15 for driving is arranged on the tip side of a rod 21 for driving a sample stand, it can move the sample stand 14 in three axis directions of X, Y, and Z independently with the coarse adjustment mechanism 7 and the fine adjustment mechanism 119. In this embodiment, although the coarse adjustment mechanism 7 is only for the major axis direction of the sample holder 1, the fine adjustment mechanism 119 is movable in the three axis directions. Moreover, although the method for moving one sample stand when two sample stands were arranged in the sample holder 1 was explained, a case where the number of sample stands arranged in the sample holder 1 and the number of sample stands that are moved are two or more does not cause, any problem in particular.

Furthermore, height adjustment screws 19, 20 are provided in both the sample stage 18 and the sample stage 15 for driving. Heights of the sample stands 13, 14 installed in the sample stage 18 and the sample stage 15 for driving are not within an operating range by the fine adjustment mechanism 119, the heights of the sample stands 13, 14 can be adjusted independently by the height adjustment screws 19, 20. These height adjustment screws 19, 20 make it possible to configure so that that the coarse adjustment mechanism 7 may need to perform a movement only in the major axis direction and the fine adjustment mechanism 119 may be sufficient to be made to perform a movement in the three axis directions. If the coarse adjustment mechanism 7 itself is configured to have drivability in the three axis directions, the size of the driving mechanism itself will increase in size, which will make the transmission electron microscope of a side entry system susceptible to an influence of vibration. Moreover, since adjustment in the three axis directions is difficult by the coarse adjustment mechanism 7 itself, it is easier to perform adjustment by giving the sample holder 1 adjustability only in the major axis direction and configuring the fine adjustment mechanism 119 to be capable of movement in the three axis directions like this embodiment.

Figure 5:
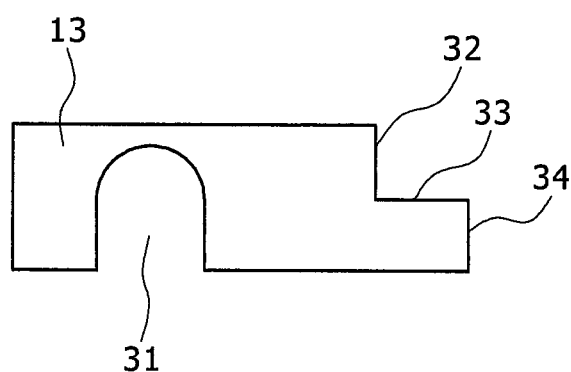
FIG. 5 is an explanatory diagram showing one example of a sample stand for mounting the sample thereon in the present invention.

FIG. 5 is an explanatory diagram showing one example of the sample stand for mounting the sample in the present invention. In the sample stand 13, an opening 31 for holding screws to allow the holding screws 12, 16 used when being fixed to the sample stage 18 and the sample stage 15 for driving to pass therethrough is provided. Moreover, sample fixation places 32, 33, and 34 are also provided in order to fix a sample piece that was extracted in the focused ion beam apparatus. The sample piece extracted in the focused ion beam apparatus may be fixed in whichever place according to the measuring method of the electron energy loss spectrum that will be described later, causing no problem. Moreover, it is also possible to fix the sample pieces to all the places simultaneously.

Figure 6:
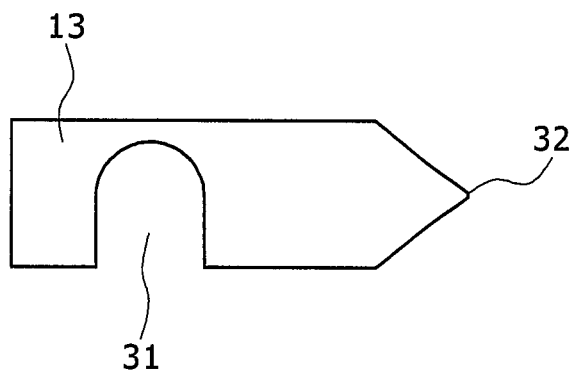
FIG. 6 is an explanatory diagram showing one example of the sample stand for mounting the sample in the present invention.

FIG. 6 is an explanatory diagram showing another one example of the sample stand for mounting the sample thereon in the present invention. The opening 31 for holding screws that allows the holding screws 12, 16 used when fixing the sample stands to the sample stages 12, 18 to pas's therethrough is provided similarly with the explanation in FIG. 5. Moreover, the sample piece extracted in the focused ion beam apparatus is fixed to the sample fixation place 32.

As described above, although one example of the sample stand for fixing the sample was shown, the shape of the sample stand is not limited to this and, for example, when the sample stand is fixed to the sample stage without using a holding screw, the opening 32 for holding screws becomes unnecessary. The sample stand of this embodiment has a merit that since a sample fixation position is located near the center of the sample stand, a sample position does not change even when a direction of the sample stand is changed.

Figure 7:
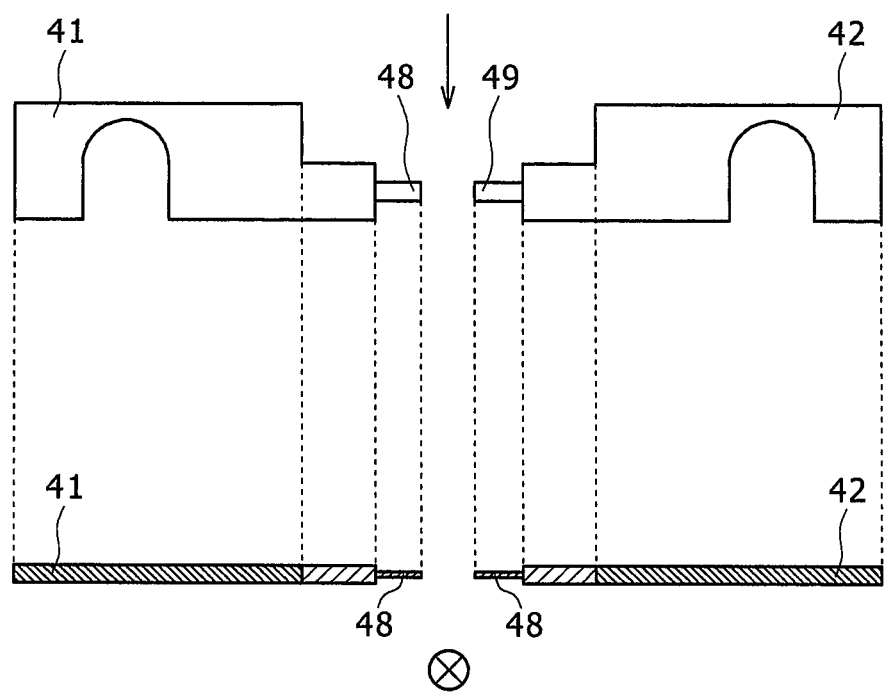
FIG. 7 is an explanatory diagram showing one example when an observation sample for a transmission electron microscope is prepared by the focused ion beam apparatus using the sample stands of FIG. 5 in the present invention.

FIG. 7 is an explanatory diagram showing one example when preparing an observation sample for a transmission electron microscope with the focused ion beam apparatus using the sample stands of FIG. 5. FIG. 7(a) is a diagram of the sample projected from a direction perpendicular to the incident direction of the ion beam, FIG. 7 (b) is a diagram of the sample projected from a direction parallel to the incident direction of the ion beam, and the both are explanatory diagrams in the case where after sample stands 41, 42 are installed on the sample holder 1, sample pieces 48, 49 are fixed to the sample fixation places 34 in the focused ion beam apparatus.

Since fixation of the sample pieces 48, 49 in the sample stands 41, 42 may be advanced from whichever side and it is possible to fix the sample piece on the one side and then fix another sample piece, arrangement of the two samples can be set with sufficient accuracy in advance.

In the sample pieces 48, 49 fixed to the sample stands 41, 42, the ion beam is made to enter them from a side of a protection layer made by depositing carbon, tungsten, aluminum, platinum, gold, or the like, and they are thinned to a sample thickness that enables observation with the transmission electron microscope and measurement of the electron energy loss spectrum. When thinning the sample pieces 48, 49, a sample holder tip opening 9 provided in the tip of the sample holder 1 is arranged on an incident direction side of the ion beam by the rolling mechanism 6 of the sample holder 1. That is, the ion beam image observed when thinning the sample piece becomes as FIG. 7(b), and cross section directions of the sample stands 41, 42 will be observed.

When there is a sufficient space that allows the tip of the sample holder 1 to be rotated by the rolling mechanism 6 in the focused ion beam apparatus, the ion beam image in an arrangement as shown in FIG. 7(a) can also be photographed.

Figure 8:
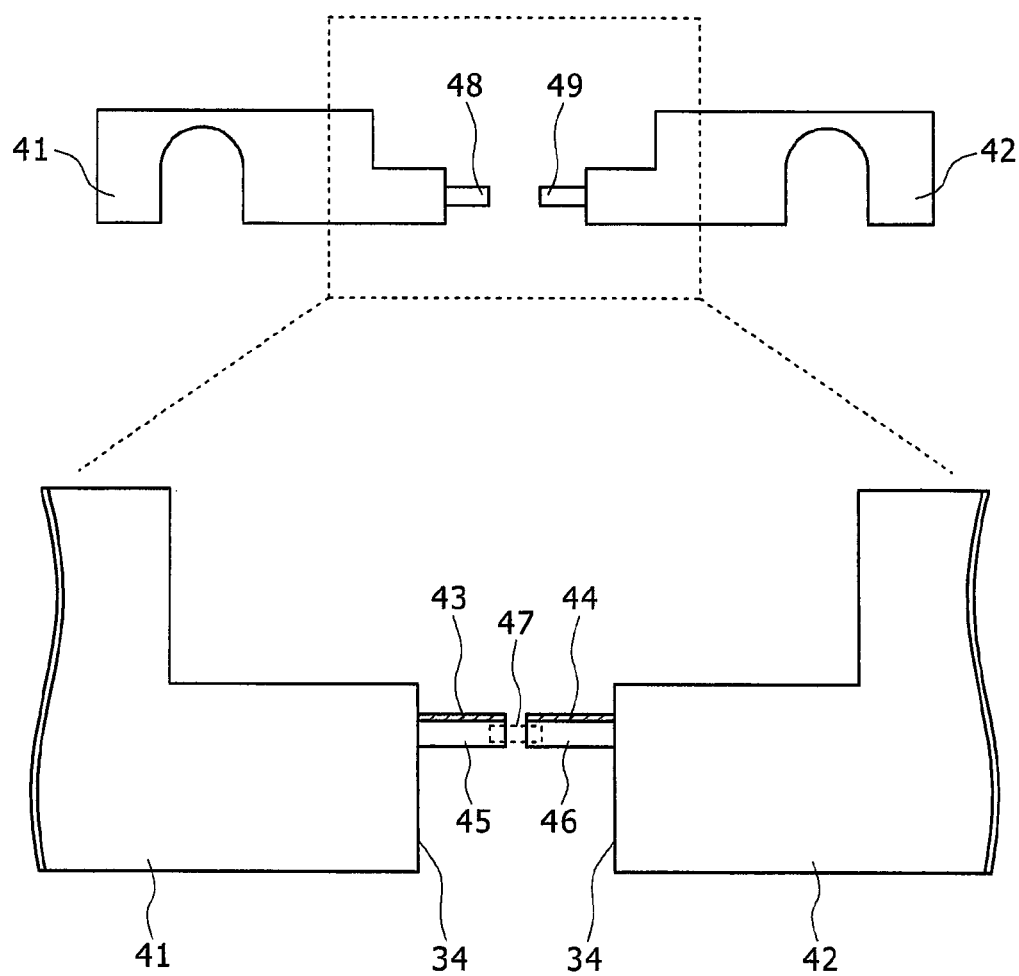
FIG. 8 is an explanatory diagram showing an arrangement of the samples when acquiring the spectral image with the transmission electron microscope having an electron spectrometer using the sample stands of FIG. 5 in the present invention.

FIG. 8 is an explanatory diagram showing an arrangement of the samples when acquiring the spectral image with the transmission electron microscope having the electron spectrometer using the sample stands of FIG. 5 in the present invention, in which after rotating the tip of the sample holder 1 with the rolling mechanism 6 and setting it up for observation in the transmission electron microscope, it is inserted into the transmission electron microscope.

When a sufficient space is secured even in the transmission electron microscope, it is also possible to rotate the sample stands within the transmission electron microscope with the rolling mechanism 6.

The figure shows a case where a sample stand 41 is fixed to the sample stage 18 and a sample stand 42 is fixed to the sample stage 15 for driving, and it is possible to make the sample pieces 48, 49 approach each other in a distance between them by moving the sample stand 42 by means of the coarse adjustment mechanism 7 and the fine adjustment mechanism 119. The sample pieces 48, 49 are comprised of protection films 43, 44 and measurement samples 45, 46 as described above.

When the major axis direction of the sample holder 1 is projected on the fluorescent screen 109 with the direction being perpendicular to the energy dispersion axis, the electron energy loss spectra can be acquired from the measurement samples 45, 46 simultaneously by restricting a spectrum acquisition area 47 with the field-of-view restriction slit 117 after bringing side faces of the sample pieces 48, 49 closer together.

Figure 9:
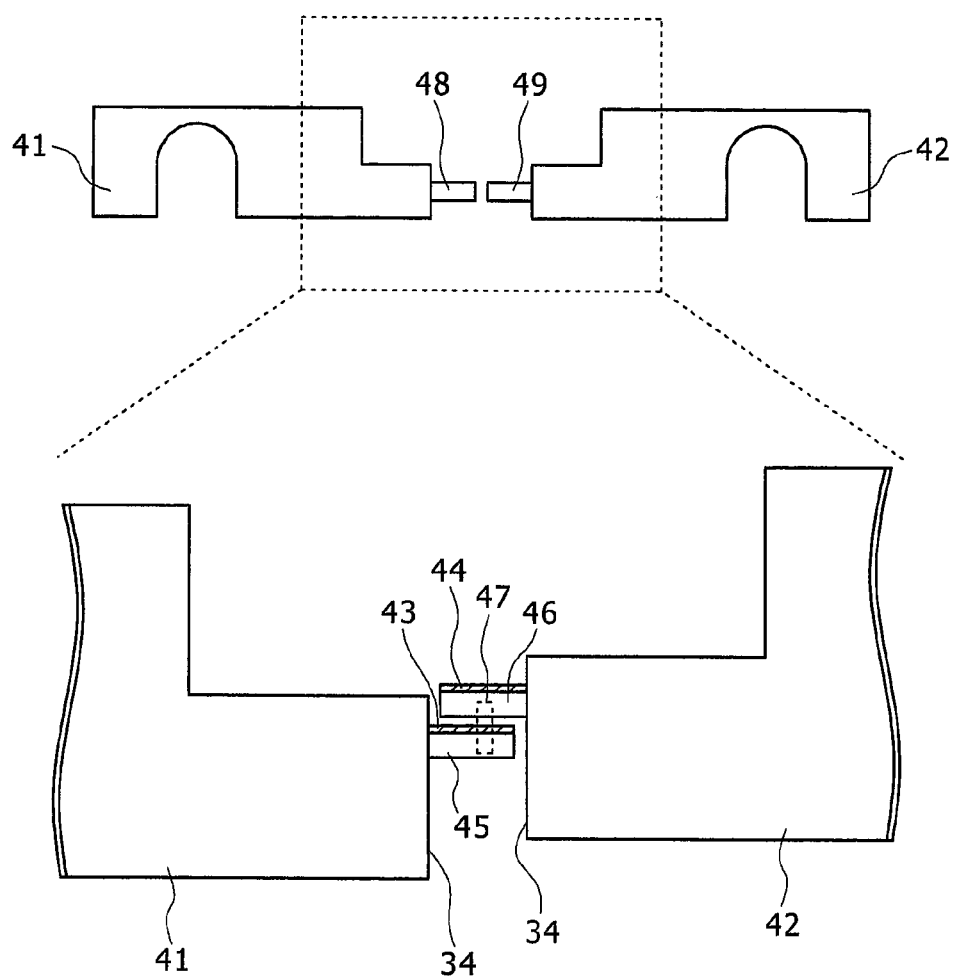
FIG. 9 is an explanatory diagram showing an arrangement of the samples when acquiring the spectral image with the transmission electron microscope having the electron spectrometer using the sample stands of FIG. 5 in the present invention.

FIG. 9 is an explanatory diagram showing an arrangement of the samples when acquiring the spectral images with the transmission electron microscope having the electron spectrometer using the sample stands of FIG. 5 in the present invention, the diagram showing the arrangement of the sample pieces 48, 49 in the case where the major axis direction of the sample holder 1 is projected on the fluorescent screen 109 being parallel to the energy dispersion axis of the electron spectrometer 108.

Similarly with FIG. 8, after bringing the sample pieces 48, 49 closer together, the electron energy loss spectrum can be acquired by restricting the spectrum measurement area 47 with the field-of-view restriction slit 117.

Figure 10:
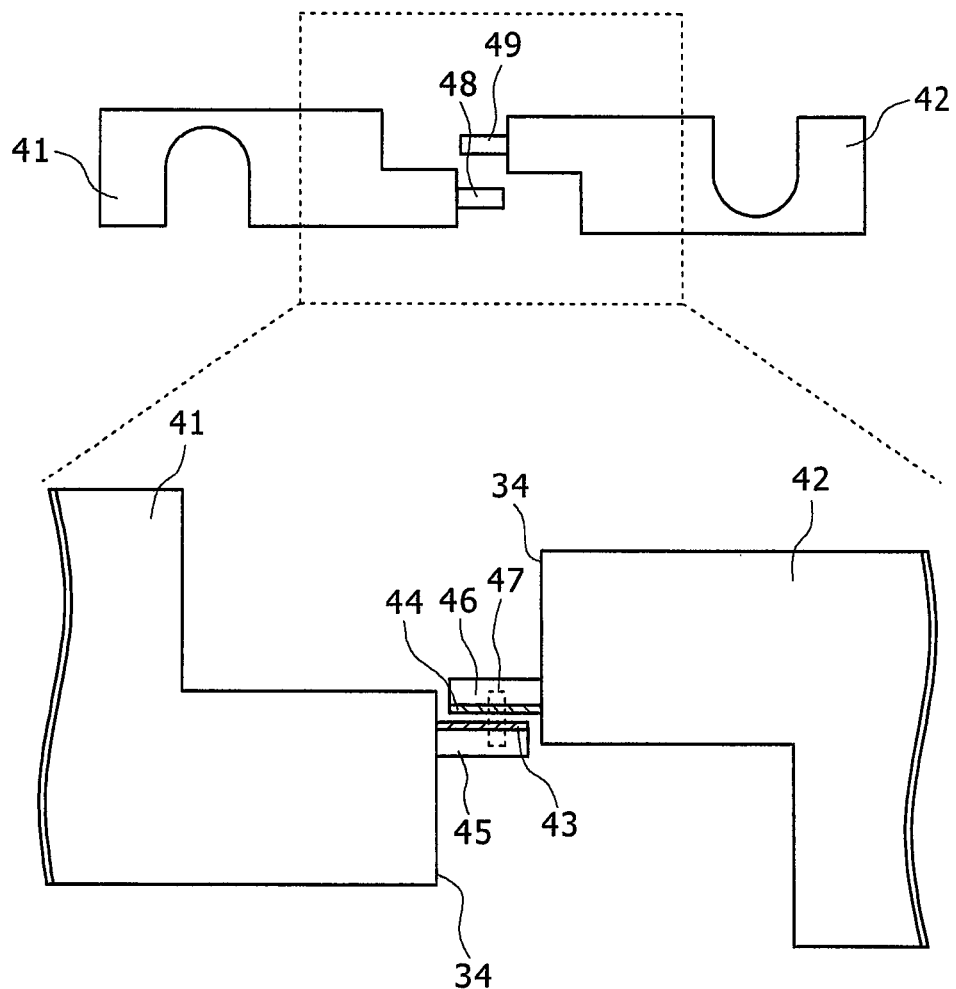
FIG. 10 is an explanatory diagram showing an arrangement of the samples when acquiring the spectral image with the transmission electron microscope having the electron spectrometer using the sample stands of FIG. 5 in the present invention.

FIG. 10 is another explanatory diagram showing an arrangement of the samples when acquiring the spectral image with the transmission electron microscope having the electron spectrometer using the sample stands of FIG. 5 in the present invention, the diagram showing the arrangement of the sample pieces 48, 49 in the case where the major axis direction of the sample holder 1 is projected on the fluorescent screen 109 being parallel to the energy dispersion axis of the electron spectrometer 108.

In the case of FIG. 9, although the sample pieces 48, 49 can be brought closer together without removing the sample stand 41 or the sample, stand 42, since the measurement sample 46 will be subjected to be measured at a place away from the protection film 44, there may be a case where the sample film thickness has not become sufficiently thin to measure the electron energy loss spectrum.

In the case described above, as shown in FIG. 10, it is possible to bring places whose thicknesses are sufficiently thin to measure the electron energy loss spectra closer together in the both measurement samples 45, 46 by, for example, inverting only the sample stand 42 so that an arrangement where the protection films 43, 44 can approach each other sufficiently may be realized after preparing the sample for a transmission electron microscope with the focused beam apparatus.

Figure 11:
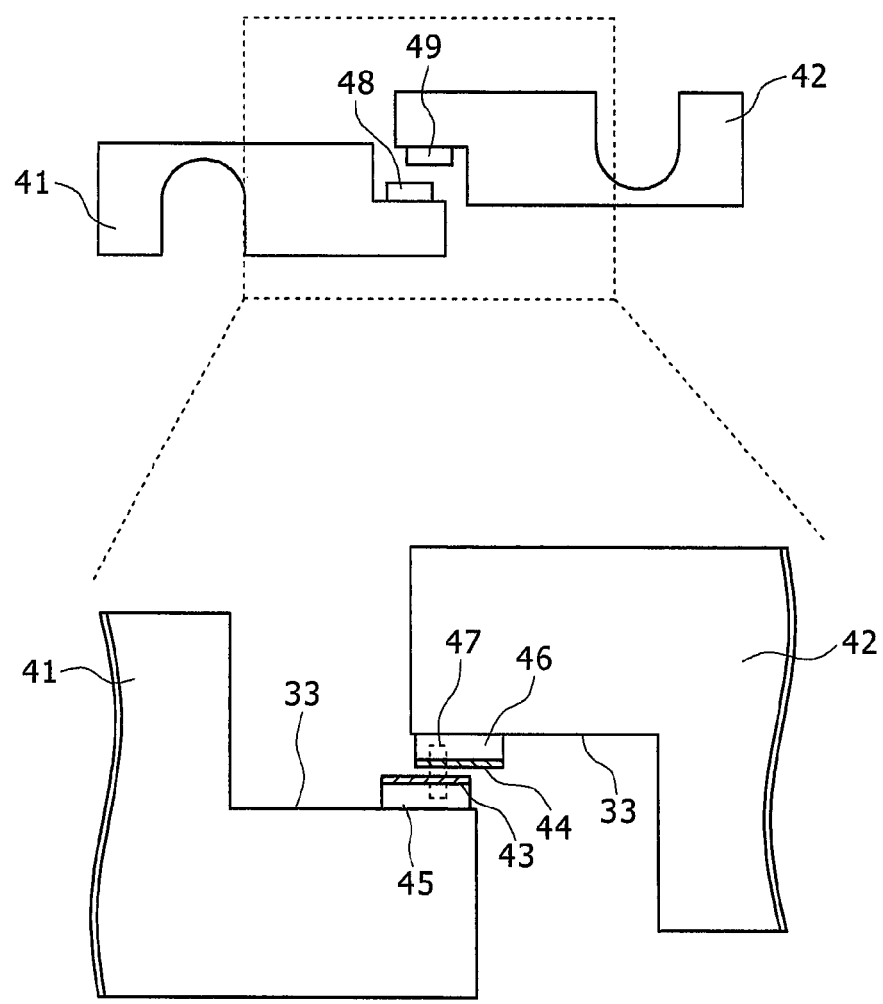
FIG. 11 is an explanatory diagram showing an arrangement of the samples when acquiring the spectral image with the transmission electron microscope having the electron spectrometer using the sample stands of FIG. 5 in the present invention.
Figure 11:

FIG. 11 is another explanatory diagram showing an arrangement of the samples when acquiring the spectral images with the transmission electron microscope having the electron spectrometer using the sample stands of FIG. 5 in the present invention, the diagram showing the arrangement of the sample pieces 48, 49 in the case where the major axis direction of the sample holder 1 is projected on the fluorescent screen 109 being parallel to the energy dispersion axis of the electron spectrometer 108.

As described above, in FIG. 9 and FIG. 10, although the side faces of the sample pieces 48, 49 were fixed to the sample stands 41, 42, in the case where fixation of the sample pieces is intended to be firm, the following method may be adopted: the sample pieces are fixed to the sample fixation places 33, after inverting one of the sample stands, the sample pieces 48, 49 are brought closer together.

In the case where the sample stand of FIG. 5 is used, it goes without saying that even when the sample piece is fixed to the sample fixation place 32, the two samples can be brought closer together similarly, and the electron energy loss spectra can be acquired.

Figure 12:
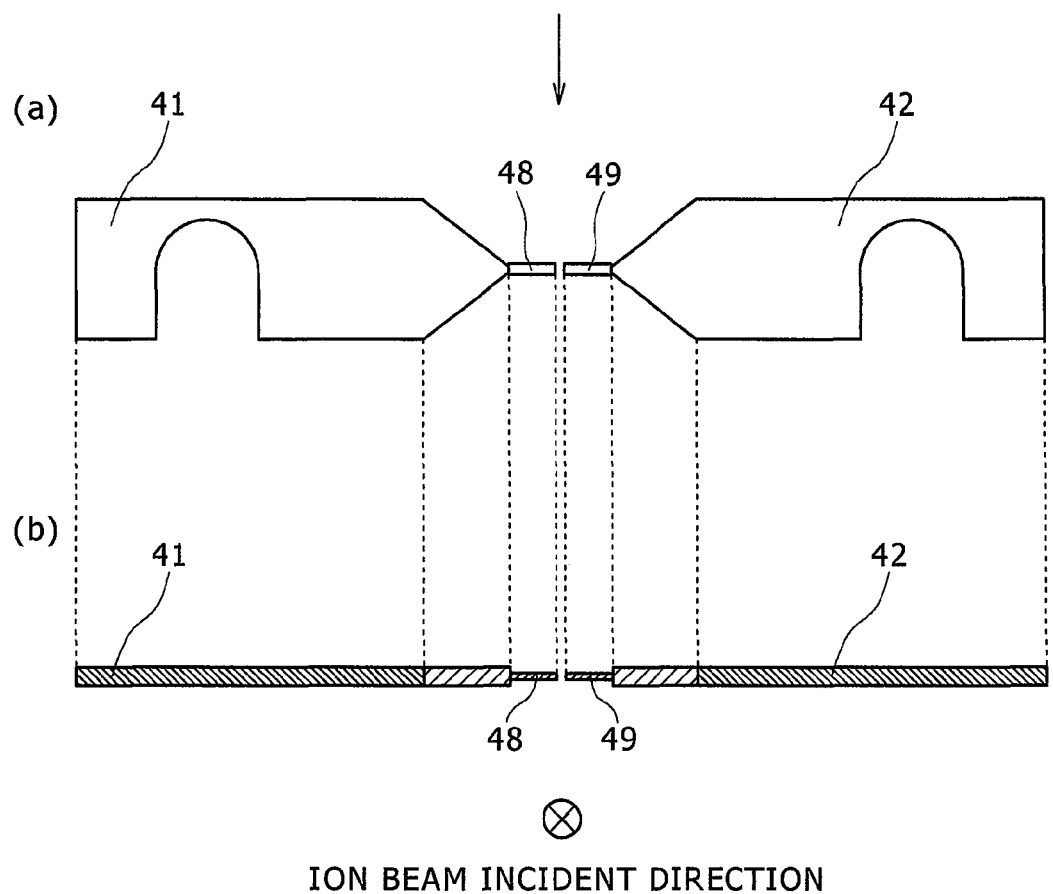
FIG. 12 is an explanatory diagram showing one example when preparing the observation sample for a transmission electron microscope with the focused ion beam apparatus using a sample stand of FIG. 6 in the present invention.

FIG. 12 is an explanatory diagram showing one example when preparing the observation sample for a transmission electron microscope with the focused ion beam apparatus using the sample stands of FIG. 6 in the present invention. FIG. 12(a) is a diagram of the sample projected from a direction perpendicular to the incident direction of the ion beam, FIG. 12(b) is a diagram of the sample projected from a direction parallel to the incident direction of the ion beam, and the both are explanatory diagrams in the case where the sample stands 41, 42 are installed in the sample holder 1, and subsequently the sample pieces 48, 49 are fixed to the sample fixation places 34 in the focused ion beam apparatus.

Also in the case of using the sample stands of FIG. 6, fixation of the sample pieces 48, 49 to the sample stands 41, 42 may be started from either side. Since after fixing the sample piece on one side, another sample piece can be fixed, it is possible to perform arrangement between the two samples with sufficient accuracy in advance.

Similarly with FIG. 7, an ion beam is made to be incident on the sample pieces 48, 49 fixed to the sample stands 41, 42 from sides of their protection layers on which carbon, tungsten, aluminum, platinum, gold, or the like is deposited, and they are thinned to a sample thickness that enables the observation of the transmission electron microscope and the measurement of the electron energy loss spectrum. When thinning the sample pieces 48, 49, the sample holder tip opening 9 provided in the tip of the sample holder 1 is arranged on the incident direction side of the ion beam by the rolling mechanism 6 of the sample holder 1. That is, an ion beam image observed when thinning the sample pieces becomes as FIG. 12(b), and the cross section directions of the sample stands 41, 42 will be observed.

Figure 13:
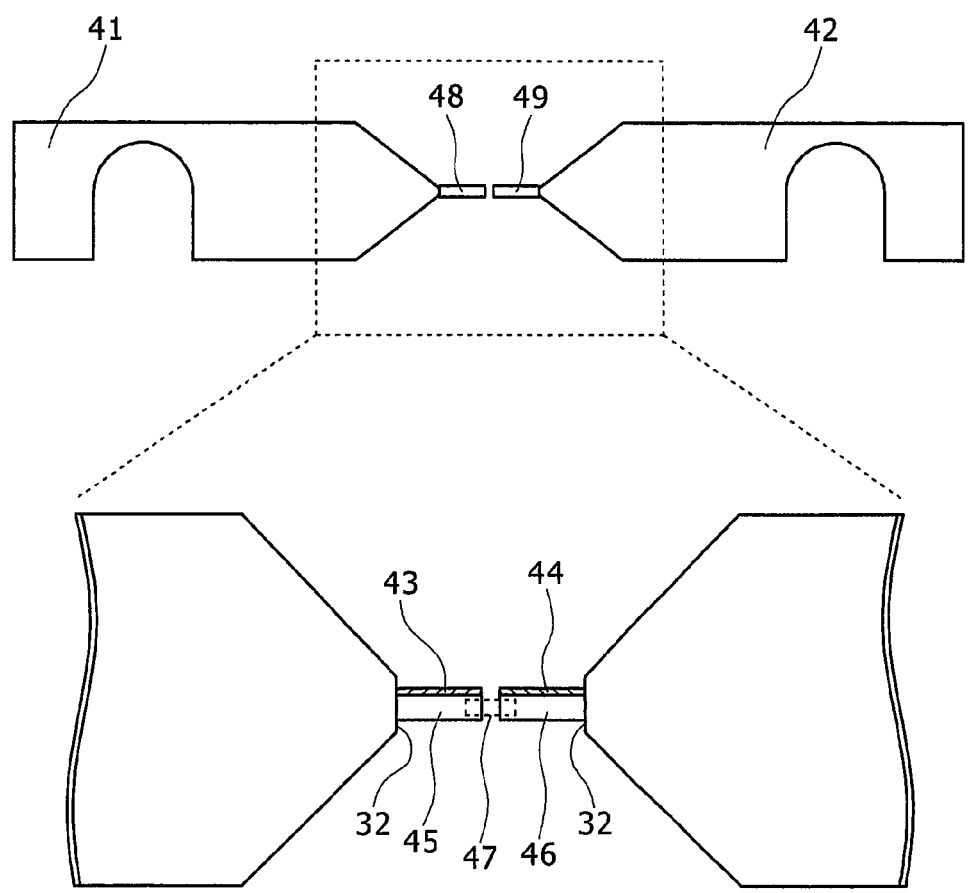
FIG. 13 is an explanatory diagram showing arrangement of the samples when acquiring the spectral image with the transmission electron microscope having the electron spectrometer using the sample stands of FIG. 6 in the present invention.

FIG. 13 is an explanatory diagram showing an arrangement of the samples when acquiring the spectral image with the transmission electron microscope having the electron spectrometer using the sample stands of FIG. 6 in the present invention, in which after rotating the tip of the sample holder 1 with the rolling mechanism 6 and setting it for the observation with the transmission electron microscope, it is inserted into the transmission electron microscope.

The figure shows a case where the sample stand 41 is fixed to the sample stage 18 and the sample stand 42 is fixed to the sample stage 15 for driving, in which the sample pieces 48, 49 can be made to approach each other in a distance between them by driving the sample stand 42 with the coarse adjustment mechanism 7 and the fine adjustment mechanism 119. The sample pieces 48, 49 are comprised of the protection films 43, 44 and the measurement samples 45, 46 as described above.

In the case where the major axis direction of the sample holder 1 is projected on the fluorescent screen 109 being crossed with the energy dispersion axis of the electron spectrometer 108, after bringing the side faces of the sample pieces 48, 49 closer together, the spectrum acquisition area 47 is restricted by the field-of-view restriction slit 117, and the electron energy loss spectra can be acquired simultaneously from the measurement samples 45, 46.

Figure 14:
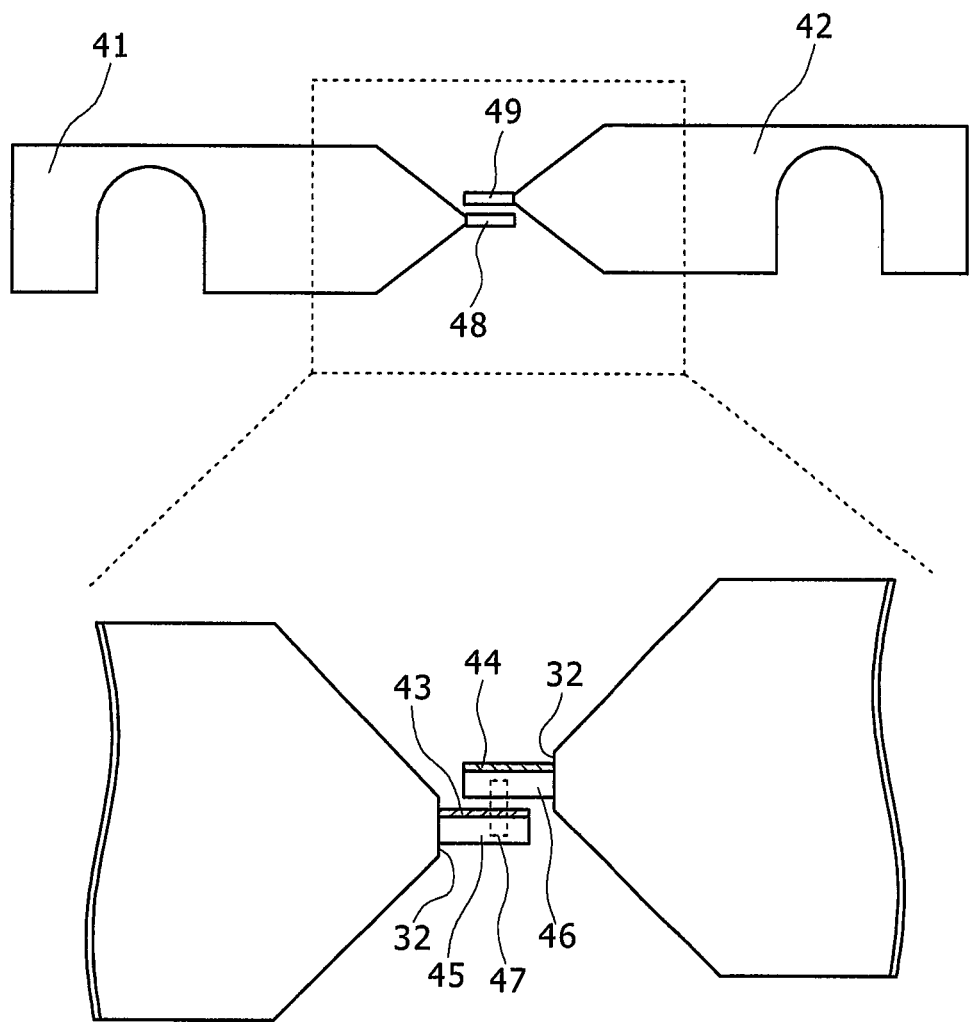
FIG. 14 is an explanatory diagram showing an arrangement of the samples when acquiring the spectral image with the transmission electron microscope having the electron spectrometer using the sample stands of FIG. 6 in the present invention.
Figure 14:

FIG. 14 is another explanatory diagram showing an arrangement of the samples when the spectral image is acquired by the transmission electron microscope having the electron spectrometer using the sample stands of FIG. 6 in the present invention, the diagram showing the arrangement of the sample pieces 48, 49 in the case where the major axis direction of the sample holder 1 is projected on the fluorescent screen 109 being parallel to the energy dispersion axis of the electron spectrometer 108.

Similarly with FIG. 13, after bringing the sample pieces 48, 49 closer together, the electron energy loss spectrum can be acquired by restricting the spectrum measurement area 47 with the field-of-view restriction slit 117.

Next, a concrete example of the above-mentioned embodiment will be shown. It shows a concrete example where spectral images of the multiple samples are acquired simultaneously using the sample holder 1 described above. This example was carried out using the transmission electron microscope 101, the spectral images were acquired simultaneously from two samples, and a chemical shift of the electron energy loss spectra obtained from the spectral images was measured. For the measurement samples, dimanganese trioxide ($Mn_2O_3$) particles (measurement sample A) and manganese oxide (MnO) particles (measurement sample B) were selected. The measurement samples were fixed to respective sample stands in the focused ion beam apparatus after respective power particles were embedded in resin.

The sample stand 41 in which the sample piece 48 containing a measurement sample A45 was fixed was installed on the sample holder tip side, i.e., on the sample stage 18, and the sample stand 42 in which the sample piece 49 containing a measurement sample B46 was fixed was installed on the sample stage 15 for driving a sample coupled to the rod 21 for driving a sample.

Figure 16:
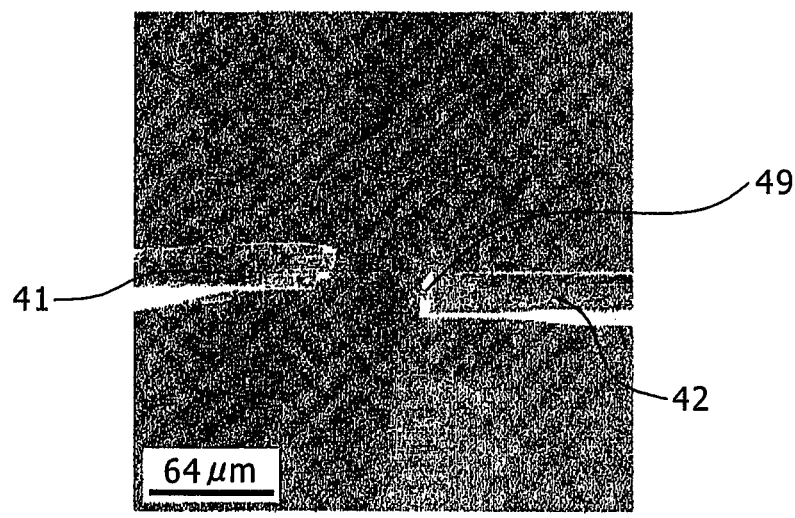
FIG. 16 is a scanning ion microscope image acquired after fixing a sample piece to the sample stand in the focused ion beam apparatus using the sample holder of the present invention.

FIG. 16 is a scanning ion microscope image acquired after fixing the sample piece 49 to the sample stand 42 installed in the sample stage 15 for driving in the focused ion beam apparatus using the sample holder 1 of the present invention. It was observed from a cross section direction of the sample stand. FIG. 16 indicates that fixation and thinning of the sample piece in the focused ion beam apparatus, are possible using the sample holder 1.

As described above, after fixing the sample piece to the sample stand and thinning it, the tip of the sample holder 1 was set to the sample position for observation with the transmission electron microscope, was drawn out of the focused ion beam apparatus, and subsequently was inserted into the transmission electron microscope, and the spectral image was acquired.

The acceleration voltage of the transmission electron microscope 101 when acquiring the spectral image was set to 200 kV, a taking-in angle of the electron ray 3 was set to 6 mrad, and energy dispersion was decided to be 0.05 eV/pixel. The image detector 113 used for acquisition of the spectral image is a two-dimensional detector of 1024×1024 pixels.

First, an observation magnification of the transmission electron microscope 101 was set to 200 times, and the measurement sample B46 was moved using the coarse adjustment mechanism 7 so as to be arranged close to the measurement sample A45 as much as possible. About positions of the both, they were checked using images on the fluorescent screen 109, and are moved so that the both samples may be arranged in a central part of the fluorescent screen 109 as much as possible.

Next, the observation magnification on display in the transmission electron microscope 1 is changed to 10,000 times, the measurement sample B46 is moved so that the measurement sample A45 and the measurement sample B46 may intersect perpendicularly to the energy dispersion axis of the electron spectrometer 8, and subsequently the measurement sample B46 was brought further closer to it by the sample movement control device 120 so that the spectral images of the measurement sample A45 and the measurement sample B46 may become simultaneously acquirable. In doing this, for checking the positions of the both, the transmission electron microscope image obtained by the image detector 113 was used.

Figure 17:
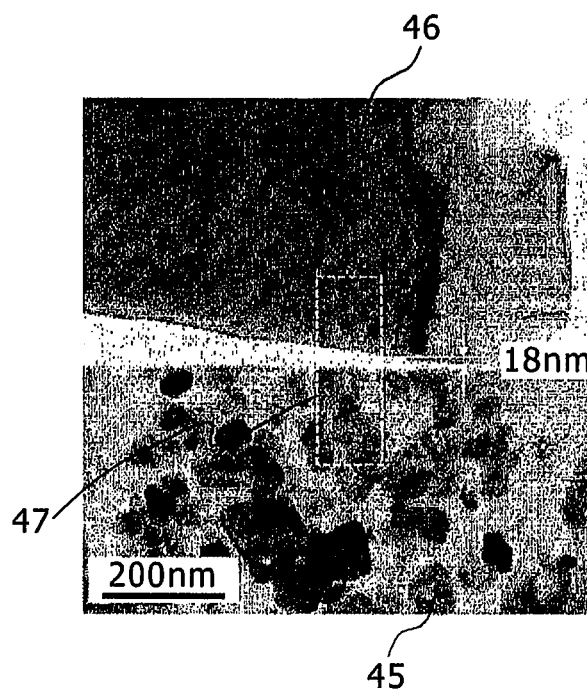
FIG. 17 is a transmission electron microscope image acquired after bringing multiple measurement samples closer together.

FIG. 17 is a transmission electron microscope image acquired after bringing the measurement sample A45 and the measurement sample B46 closer together. In FIG. 17, the measurement sample A45 and the measurement sample B46 approach with an interval of about 20 nm. Moreover, it was found that the both samples were located in the spectrum acquisition area 47 and the spectral images could be acquired simultaneously from the both samples. Moreover, a fact that the samples are clear from the transmission electron microscope image in FIG. 17 means that a sample drift that is satisfactory to observe the transmission electron microscope image is realized.

Next, the observation magnification was changed to 50,000 times and the spectral images of the measurement sample A45 and the measurement sample. B46 were acquired simultaneously. The spectral image was acquired in an L-shell absorption edge region of manganese, and the electron energy loss spectrum was extracted from each sample in the spectral image obtained from the L-shell absorption edge region of manganese.

Figure 18:
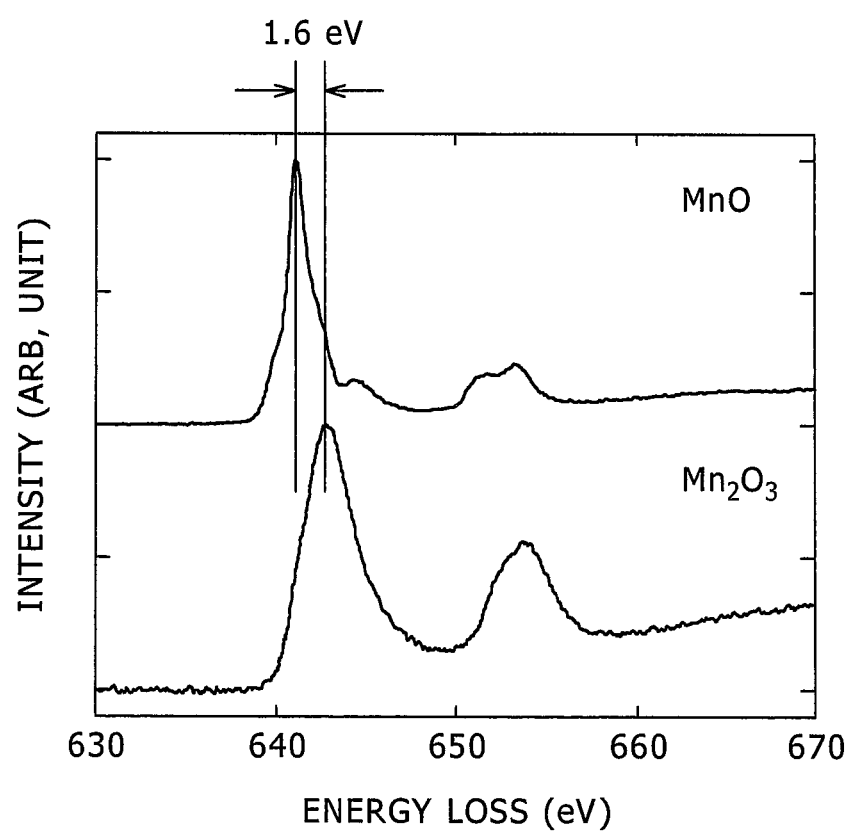
FIG. 18 is electron energy loss spectra acquired from multiple samples.

FIG. 18 is the electron energy loss spectra acquired from, the both samples. As a result of measuring the chemical shift between the both samples, it turned out that the chemical shift of dimanganese trioxide is shifted to a high loss energy side by about 1.6 eV as compared with manganese oxide Conventionally, in the processing of the sample for a transmission electron microscope with the focused ion beam apparatus, it was necessary to change a sample prepared in another sample holder to be in a sample holder that has at least one movable sample stand, a working efficiency from sample preparation to transmission electron microscope observation and measurement of the electron energy loss spectrum was bad.

However, the present technology makes possible sample preparation for a transmission electron microscope to observation thereof with a single sample holder. Thus, since according to the present invention, the electron energy loss spectra can be acquired simultaneously with a high spatial resolution from sample preparation for a transmission electron microscope of multiple samples, the sample preparation whose measurement was heretofore complicated can be simplified, and therefore it is possible to widen a measurement range of chemical shift to the sample.

In this embodiment, although a content of this sample holder being applied to the measurement of the electron energy loss spectrum was explained, the present invention is not limited to the embodiment, and can be applied, for example, to electron diffraction, length measurement, and further aberration correction of a (scanning) transmission electron microscope with spherical aberration correction, etc.

In this the embodiment, regarding applications of the sample holder 1, only the measurement of the electron energy loss spectrum was described, but it is applicable as means for correctly measuring information of a standard sample and the measurement sample.

Moreover, if an O-ring or a tip cover is mounted on the tip of the sample holder 1, movement to the transmission electron microscope from the focused ion beam apparatus is also possible without exposing it to the atmosphere.

Furthermore, voltage application measurement is also possible by installing a tungsten wire, etc. whose tip is sharpened, not installing the sample stand, on the sample stage for driving, and making it couple with a sample mounted on the sample stage. Moreover, dynamics characteristics of the sample can also be measured by adjusting how to push the tungsten wire. Arrangements of the sample stand and the tungsten wire are not limited to this.

Moreover, in the case of an apparatus that combines the focused ion beam apparatus and the transmission electron microscope or the scanning electron microscope together, transmission images and element analysis results of the samples can be obtained by making the ion beam enter from the holder tip opening 9 of the sample holder 1 on which multiple sample stands are installed while thinning the samples fixed to the multiple sample stands.

In the foregoing, although the invention made by these inventors was specifically explained based on the embodiments, it goes without saying that the present invention is not limited to the embodiment, and can be altered variously within a range that does not deviate from its gist.

LIST OF REFERENCE SIGNS

1 Sample holder
2 Guide pin
3 Guide cover
4 Guide pin hole
5 Knob
6 Rolling mechanism
7 Coarse adjustment mechanism
8 Connector
9 Holder tip opening
11, 17 Sample stand presser plate
12, 16 Holding screw
13, 14, 41, and 42 Sample stand
15 Driving sample stage
18 Sample stage
19, 20 Height adjustment screw
21 Sample stand driving rod
31 Opening for holding screw
32, 33, and 34 Sample fixation place
43, 44 Protection film
45, 46 Measurement sample
47 Spectrum acquisition area
48, 49 Sample piece
101 Transmission electron microscope
102 Electron source
103 Electron ray
104 Focusing lens
106 Objective lens
107 Imaging lens system
108 Electron spectrometer
109 Fluorescent screen
110 Magnetic field sector
111, 112 Multipole lens
113 Image detector
114 Image display
115 Data storage device
116 Central controller
117 Field-of-view restriction slit
118 Sample holder moving device
119 Fine adjustment mechanism
120 Sample fine adjustment controller

The invention claimed is:

1. A charged particle beam apparatus, comprising:
a sample holder including a first sample stage on which a first sample stand for a first sample is installed on a tip of the sample holder and a second sample stage on which a second sample stand for a second sample different from the first sample is installed on the tip of the sample holder;
a sample driving part configured to move the first sample stand and the second sample stand, the sample driving part including a coarse adjustment mechanism configured to move at least one of the first sample stand and the second sample stand in a major axis direction of the sample holder, and a fine adjustment mechanism configured to move both the first sample stand and the second sample stand in three mutually perpendicular axis directions;
a rolling mechanism configured to rotate the tip of the sample holder;
an electron spectrometer to detect electrons from the first sample and the second sample; and
a processor which acquires a chemical shift of electron energy loss spectra from a first image of the first sample and a second image of the second sample based on the detection from the electron spectrometer,
wherein the first sample holder, the second sample holder, the coarse adjustment mechanism and the fine adjustment mechanism are each rotated by the rotation of the rolling mechanism.

2. The charged particle beam apparatus according to claim 1,
wherein the tip of the sample holder has an opening that allows a charged particle beam to pass therethrough, and
wherein an electron ray which irradiates the first sample and the second sample in the electron spectrometer is perpendicular to the charged particle beam.

3. The charged particle beam apparatus according to claim 1,
wherein the first sample stand is fixed to the first sample stage by a first sample stand presser plate and a first holding screw, and the second sample stand is fixed to the second sample stage by a second sample stand presser plate and a second holding screw.

4. The charged particle beam apparatus according to claim 1,
wherein the sample holder is used in common in a transmission electron microscope and a focused ion beam apparatus.

5. The charged particle beam apparatus according to claim 1,
wherein the sample holder comprises:
a first holding screw for fixing the first sample stand, a second holding screw for fixing the second sample stand, and an opening which allows the first holding screw and the second holding screw to pass there through.

6. The charged particle beam apparatus according to claim 1,
wherein the tip of the sample holder includes a holder tip opening that is opened in a direction different from a passing direction of a charged particle beam.

7. The charged particle beam apparatus according to claim 6,
wherein the holder tip opening is opened in a direction perpendicular to the passing direction of the charged particle beam.

8. The charged particle beam apparatus according to claim 1,
wherein the first sample stage includes a first height adjustment screw that can vary a height of the first sample stand, and the second sample stage includes a second height adjustment screw that can vary a height of the second sample stand.

9. The charged particle beam apparatus according to claim 1,
wherein the first sample fixed to the first sample stand and the second sample fixed to the second sample stand are arranged in a direction perpendicular to an energy dispersion axis of the electron spectrometer.

* * * * *